United States Patent [19]

Yao

[11] Patent Number: 4,837,513

[45] Date of Patent: Jun. 6, 1989

[54] MRI USING ASYMMETRIC RF NUTATION PULSES AND ASYMMETRIC SYNTHESIS OF COMPLEX CONJUGATED SE DATA TO REDUCE TE AND T2 DECAY NMR SPIN ECHO RESPONSES

[75] Inventor: Ching Yao, Belmont, Calif.

[73] Assignee: The Regents of the University of California, Berkeley, Calif.

[21] Appl. No.: 283,059

[22] Filed: Dec. 5, 1988

Related U.S. Application Data

[63] Continuation of Ser. No. 181,386, Apr. 14, 1988, abandoned.

[51] Int. Cl.$^4$ ............................................ G01R 33/20
[52] U.S. Cl. ...................................... 324/309; 324/312
[58] Field of Search .......................... 324/309, 312, 314

[56] References Cited

U.S. PATENT DOCUMENTS

| | | | |
|---|---|---|---|
| 3,495,162 | 2/1970 | Nelson | 324/310 |
| 3,496,454 | 2/1970 | Nelson | 324/320 |
| 4,300,096 | 11/1981 | Harrison et al. | 324/309 |
| 4,509,015 | 4/1985 | Ordidge et al. | 324/309 |
| 4,573,014 | 2/1986 | Riederer | 324/312 |
| 4,707,661 | 11/1987 | Hoenninger, III | 324/309 |
| 4,713,616 | 12/1987 | Shimazaki et al. | 324/312 |
| 4,724,387 | 2/1988 | Sano et al. | 324/309 |
| 4,724,388 | 2/1988 | Sano et al. | 324/309 |
| 4,728,893 | 3/1988 | Feinberg | 324/312 |
| 4,737,714 | 4/1988 | Hanawa | 324/309 |

OTHER PUBLICATIONS

Morgan et al, "NMR Velocity-Selective Excitation Composites for Flow and Motion Imaging and Suppression of Static Tissue Signal", IEEE Trans. Med. Imaging, vol. MI-6, No. 2, Jun. 1987.

Margosian et al, "Faster Imaging: Imaging with Half the Data", Health Care Instrumentation, 1:195-197; 1986.

Haache, "The Effects of Finite Sampling on Image Quality in MRI", Soc. of Mag. Res. in Med. Book of Instructs, 5th Ann. Mtg. vol. 1, Aug. 19, 1986, pp. 263-264.

Provost et al, "Asymmetric Sampling in 2DFT Magnetic Resonance Imaging", Soc. of Mag. Res. in Med. Book of Instructs, 5th Ann. Mtg. vol. 1, Aug. 19, 1986, pp. 265-266.

DeMeester et al, "Phase Correlations for a Reconstruction Method Using Data Reflection", Soc. of Mag. Res. in Med. Book of Instructs, 5th Ann. Mtg. vol. 1, Aug. 19, 1986, pp. 267-268.

Wood et al, "Parametric Modelling for Reconstructing Mr Images", Soc. of Mag. Res. in Med. Book of Instructs, 5th Ann. Mtg. vol. 1, Aug. 19, 1986, pp. 269-270.

Ehrhardt, "Image Reconstruction with Reduced Multiplication, Multi-Dimensional Discrete Fourier Transforms for Non-Rectangualrly Sampled Data", Soc. of Mag. Res. in Med. Book of Instructs, 5th Ann. Mtg. vol. 1, Aug. 19, 1986, pp. 271-272.

Crooks et al, "Echo-Planar Pediatric Imager", Radiology 1988; 166:1570163.

Inubushi et al, "Efficient Detection of Paramagnetically Shifted NMR Resonances by Optimizing the WEFT Pulse Sequence", J. Mag. Res. 51, pp. 128-133 (1983).

Murdoch et al, "Computer-Optimized Narrowband Pulses for Multislice Imaging", J. Mag. Res. 74, pp. 226-263 (1987).

Loaiza et al, "Selective Excitation Without Phase Distortion Using Self-Refocused Amplitude-and Amplitude/Phase-Modulated Pulses," J. Mag. Res. 77, pp. 175-181 (1988).

Ngo et al, "A New Method for the Optimization of Nuclear Magnetic Resonance Selective Excitation Pulses," Biochemical Society Trns., vol. 14, pp. 1271-1272, 1986.

*Primary Examiner*—Stewart J. Levy
*Assistant Examiner*—Kevin D. O'Shea
*Attorney, Agent, or Firm*—Nixon & Vanderhye

[57] ABSTRACT

Reduced T2 decay is achieved through use of at least one asymmetrically truncated RF nutation pulse and an asymmetrically sampled NMR RF response with missing asymmetric data being supplied by complex conjugate synthesis.

14 Claims, 4 Drawing Sheets

MRI USING ASYMMETRIC RF NUTATION PULSES AND ASYMMETRIC SYNTHESIS OF COMPLEX CONJUGATED SE DATA TO REDUCE TE AND T2 DECAY NMR SPIN ECHO RESPONSES

This is a continuation of application Ser. No. 181,386 filed on Apr. 14, 1988, now abandoned.

This invention is generally related to magnetic resonance imaging (MRI) utilizing nuclear magnetic resonance (NMR) phenomena. It is more particularly directed to apparatus and method for practicing MRI so as to reduce or minimize the time-to-echo TE, thereby reducing T2 decay of the NMR RF spin echo response (and thus simultaneously saving data acquisition time and enhancing the potential signal-to-noise ratio of the resulting MRI image).

This application is related to the copending commonly assigned application S.N. 07/181440 of Yao et al filed Apr. 14, 1988, and entitled MRI COMPENSATED FOR SPURIOUS NMR FREQUENCY/PHASE SHIFTS CAUSED BY SPURIOUS CHANGES IN MAGNETIC FIELDS DURING NMR DATA MEASUREMENT PROCESSES.

MRI is now a widely accepted and commercially available technique for obtaining digitized visual images representing the internal structure of objects (such as the human body) having substantial populations of nuclei which are susceptible to NMR phenomena. In general, the MRI process depends upon the fact that the NMR frequency of a given nucleus is directly proportional to the magnetic field superimposed at the location of that nucleus. Accordingly, by arranging to have a known spatial distribution of magnetic fields (typically in a predetermined sequence) and by suitably analyzing the resulting frequency and phase of NMR RF responses (e.g., through multi-dimensional Fourier Transformation processes), it is possible to deduce a map or image of relative NMR responses as a function of the location of incremental volume elements (voxels) in space. By an ordered visual display of this data in a suitable raster scan on a CRT, a visual representation of the spatial distribution of NMR nuclei across a cross-section of an object under examination may be produced (e.g., for study by a trained physician).

In at least some typical NMR systems now commercially available (e.g., those available from Diasonics Inc.), one or more NMR spin echo RF responses are elicited from an imaged object volume by using a succession of slice-selective NMR RF pulses having shaped envelopes. For example, a slice-selective 90° RF nutation pulse may be utilized to selectively nutate NMR nuclei within a selected slice volume by substantially 90°. After a time delay, a slice-selective 180° RF nutation pulse is used to nutate those same nuclei by 180°. After an equal further time delay, the thus nutated NMR nuclei within the selected slice come back into phase with one another so as to emit a characteristic "spin echo" RF response. The total elapsed time from the initial 90° nutation to the occurrence of the envelope peak of the spin echo is typically referred to as the "time-to-echo" or "TE".

Unfortunately, the amplitude of such spin echo response is reduced by an exponential decay commonly referred to as the "T2" NMR parameter of the NMR nuclei. Accordingly, where NMR spin echo data is utilized for MRI, it has already been recognized that the signal-to-noise ratio of the measured spin echo signal can be enhanced by reducing or minimizing TE. Such signal-to-noise ratio is, of course, also a function of the total time window over which the spin echo RF response signal is actually measured (e.g., typically by digitized complex-valued samples of the RF waveform taken at approximately 10 to 30 microsecond intervals).

In addition to a possibly enhanced signal-to-noise ratio if TE can be reduced or minimized, it is also always preferable in MRI to minimize the required total data acquisition time. For example, it is typically necessary to repeatedly measure NMR responses several hundred times from a given slice volume in order to accumulate the requisite NMR response data required to produce a high resolution NMR image. Typically, several minutes or even tens of minutes may be required for an overall scan sequence. For reasons of economy as well as patient comfort and to also avoid possible image artifact (e.g., caused by moving elements within the image) or even to facilitate whole new MRI strategies, it is always a goal of MRI designers to minimize the overall required data acquisition time. This time saving may also be utilized to permit greater numbers of slice-volumes to be examined in a given TR interval.

Asymmetric sampling of a spin echo response has already been proposed by others. For example, see "Asymmetric Sampling And 2DFT Magnetic Resonance Imaging" by Provost et al, Abstract presented at the August 1986 Meeting of the Society of Magnetic Resonance in Medicine. Here, the goal was to shift the center of the sampling window away from the center of the spin echo response in the time domain thus permitting a longer total duration of SE sampling—with an attendant potential increase in the available signal-to-noise ratio. It was also recognized that such asymmetric sampling of the spin echo response permitted reductions in TE for a given bandwidth.

It appears that Provost et al considered the asymmetrically sampled data merely to introduce a phase shift in the transform data which vanishes when the magnitude image is calculated. Actually, the Provost et al approach causes progressive loss of resolution as the asymmetry is increased. Provost et al do not consider the possibility of synthesizing the "missing" data so as to restore full resolution to the image.

Asymmetric RF nutation pulse envelopes have also been proposed in the past for certain purposes. See, for example:

Murdoch, et al, "Computer-Optimized Narrowband Pulses for Multislice Imaging", J. Mag. Res. 74, 226-263 (1987); and Loaiza et al, "Selective Excitation Without Phase Distortion Using Self-Refocused Amplitude and Amplitude/Phase-Modulated Pulses", J. Mag. Res. 77, 175-181 (1988).

Murdoch et al propose asymmetric RF nutation pulses of a wide variety for the special purpose of achieving better slice volume definition (i.e. achieving NMR nutation/response from a slice volume having more precisely located "side walls"). Loaiza et al, on the other hand, also seek to minimize phase distortion without the need for separate phase correcting gradient pulses.

I have now discovered techniques for reducing TE (and hence reducing T2 decay) which involve the use of asymmetric RF nutation pulses combined with asymmetric synthesis of complex-conjugated spin echo data.

For example, I have discovered that it is possible to transmit at least one RF nutation pulse (e.g., a 90° nutation pulse) having an asymmetric envelope while still achieving the requisite NMR nuclei nutation (providing that its amplitude is suitably adjusted). If the asymmetry of the RF nutation pulse envelope(s) is properly directed, it facilitates a reduction in the minimum elapsed time interval between a succession of RF nutation pulses required to elicit a spin echo NMR RF response. It also facilitates reduced TE where gradient pulse reversals are used with a single RF pulse to recall an FID "spin echo". Accordingly, such asymmetry in one or more RF nutation pulses permits reduced or minimized TE with attendant reduction in T2 decay and enhancement of potential signal-to-noise ratio (which may, of course, be used in a tradeoff for improvement of other related NMR MRI parameters).

In conjunction with such asymmetric RF nutation pulse, I have also discovered that it is possible not only to merely asymmetrically sample the spin echo response and thus lengthen the actual duration of signal measurement (with attendant increases in potential signal-to-noise ratio)—but that it is also possibly to synthetically increase the effective time duration of sampling in the other direction by asymmetrically synthesizing complex-conjugated spin echo data (e.g., so as to reconstruct the spin echo signal which would occur if the spin system was allowed to evolve from the center of the echo backwards in time, with the RF pulses removed). Filling in this portion of the data is essential if full image resolution is to be realized.

By employing both types of asymmetric processes simultaneously, the TE can be substantially reduced and signal-to-noise increased with all of the expected attendant advantages mentioned above.

These as well as other objects and advantages of this invention will be better appreciated and understood by carefully reading the following detailed description of a presently preferred exemplary embodiment, in conjunction with the accompanying drawings, of which:

Figure 1:
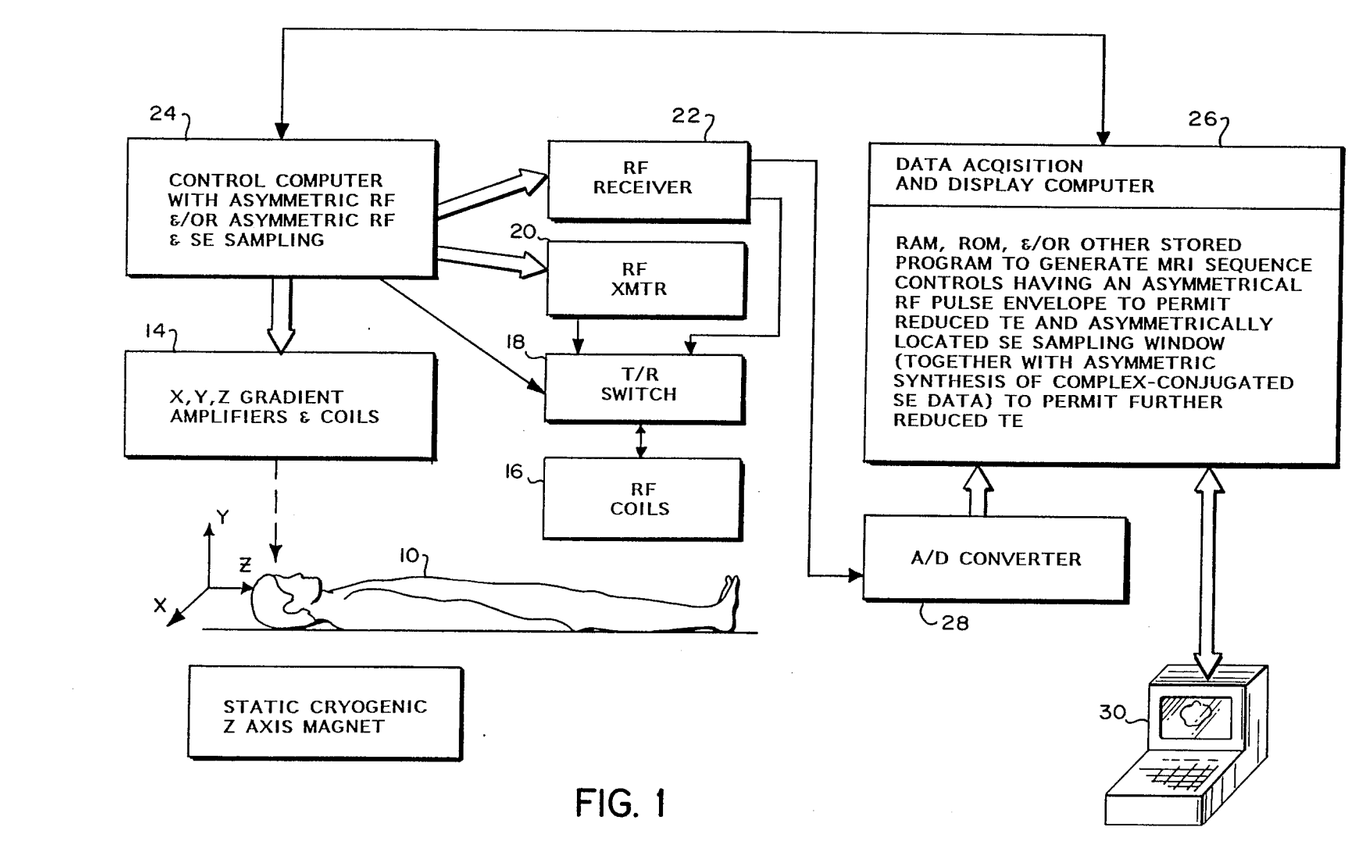
FIG. 1 is a generalized schematic block diagram of an MRI system modified so as to employ the presently preferred exemplary embodiment of this invention.

The novel signal processing and control procedures utilized in the exemplary embodiment typically can be achieved by suitable alteration of stored controlling computer programs in existing MRI apparatus. As one example of such apparatus, the block diagram of FIG. 1 depicts the general architecture which may be employed in such a system.

Typically, a human or animal subject (or other object) 10 is inserted along the z-axis of a static cyrogenic magnet which establishes a substantially uniform magnetic field directed along the z-axis within the portion of the object of interest. Gradients are then imposed within this z-axis directed magnetic field along the x,y or z axes by a set of x,y,z gradient amplifiers and coils 14. NMR RF signals are transmitted into the body 10 and NMR RF responses are received from the body 10 via RF coils 16 connected by a conventional transmit/-receive switch 18 to an RF transmitter 20 and RF receiver 22.

All of the prior mentioned elements may be controlled, for example, by a control computer system 24 which conventionally communicates with a data acquisition and display computer system 26. The latter computer 26 may also receive NMR RF responses via an analog-to-digital converter 28. A CRT display and keyboard unit 30 typically also is associated with the data acquisition and display computer 26.

As will be apparent to those in the art, such an arrangement may be utilized so as to generate desired sequences of magnetic gradient pulses and NMR RF pulses and to measure NMR RF responses in accordance with stored computer programs. As depicted in FIG. 1, the MRI system of this invention will typically include RAM, ROM and/or other stored program media adapted (in accordance with the following descriptions) so as to generate sequence controls (either via computer 26 or directly in control computer 24) having an asymmetrical RF pulse envelope to permit reduced TE and asymmetrically located SE sampling windows (with associated asymmetric synthesis of conjugated SE data). The resulting, partly synthesized (spin echo data) may then be conventionally processed (e.g., via multi-dimensional Fourier Transformation) into final high resolution NMR images.

Figure 2:
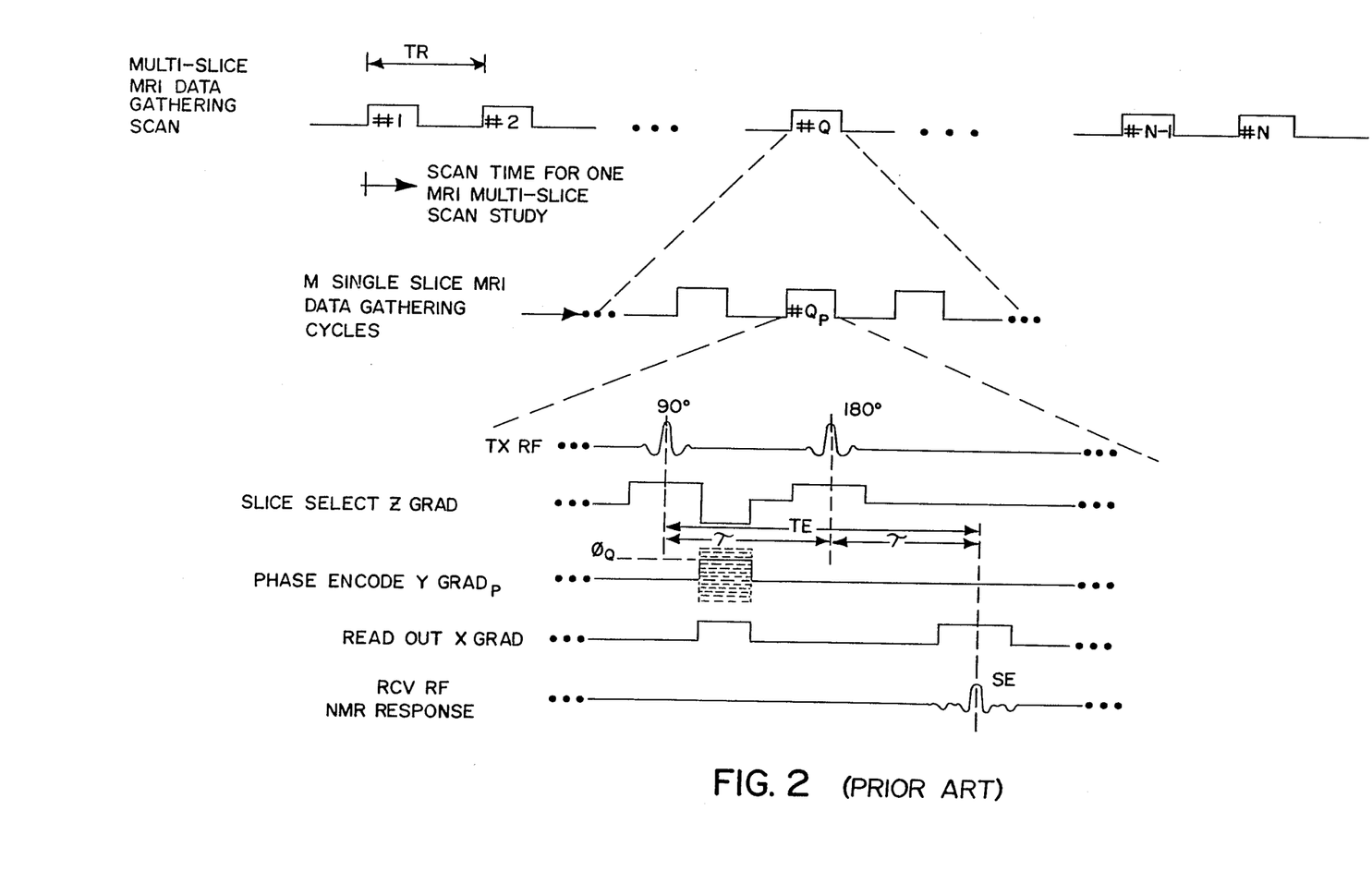
FIG. 2 is a diagrammatic depiction of prior art MRI data gathering sequences.

FIG. 2. depicts a typical prior art data acquisition sequence. Here, a single MRI data gathering scan or "study" involves a number N (e.g., 128 or 256) of successive data gathering cycles. In fact, if, as depicted in FIG. 2, a multi-slice scan is involved, then each of the N events comprising a single scan or "study" may actually comprise M single slice MRI data gathering cycles. In any event, for a given single slice data gathering cycle p, a slice selection z-axis gradient pulse (and associated phase correction pulse) may be employed to selectively address a transmitted 90° RF nutation pulse into a slice volume centered about the center frequency of the transmitted RF signal and of sufficient magnitude and duration so as to nutate a substantial population of nuclei within the selected slice-volume by substantially 90°. Thereafter, a y-axis gradient pulse is employed (of magnitude $\phi_Q$ *for this particular cycle and varying between maximum magnitudes of both polarities over the N data gathering cycles for that particular slice*).

After a predetermined elapsed time, a 180° RF NMR nutation pulse will be transmitted selectively to the same slice volume (via application of the appropriate z-axis gradient). In accordance with the "rule of equal times," a true spin echo signal SE evolves after a further similar elapsed time. During the recordation of the RF NMR response signal (where amplitude and phase of RF is measured at successive sample points), a readout x-axis magnetic gradient is employed so as to provide spatial frequency encoding in the x-axis dimension. Additional spin echo responses can also be elicited by the use of additional 180° nutation pulses or suitable other techniques—albeit they will be of decayed amplitude due to the NMR T2 decay.

The time-to echo TE is depicted in FIG. 2 as is the repetition time TR parameter. As just explained, RE interacts with the T2 NMR exponential decay parameter to reduce signal amplitude. The TR interacts with the T1 NMR exponential recovery parameter so that one generally has to wait for substantial relaxation of previously excited nuclei before the next measurement cycle of the same volume can begin.

It will be noted that during each RF excitation pulse, there is a slice selection $G_z$ magnetic gradient pulse switched "on" so as to selectively excite only the desired "slice" or "planar volume" (e.g., a slice of given relatively small thickness such as 5 or 10 millimeters through the object being imaged). During each resulting spin echo NMR RF response, x-axis phase encoding is achieved by applying an x-axis magnetic gradient during the readout procedure (typically each spin echo pulse is sampled every 30 microseconds or so with digitized sample point complex valued data being stored for later signal processing).

As depicted in FIG. 2, it will be understood that, in practice, the number of measurement cycles typically is equal to the number of desired lines of resolution along the y-axis in the final image (assuming that there is no data synthesis via conjugation processes). After a measurement cycle is terminated with respect to a given "slice," it is allowed to relax for a TR interval (usually on the order of relaxation time T1) while other "slices" are similarly addressed so as to obtain their spin echo responses. Typically, on the order of hundreds of such measurement cycles are utilized to obtain enough data to provide hundreds of lines of resolution along they y-axis dimension. A sequence of N such y-axis phase encoded spin echo signals is then typically subjected to a two-dimensional Fourier Transformation process to result in an N×N array of pixel values for a resulting NMR image in a manner that is by now well understood in the art.

The data set generated in a standard 2DFT NMR imaging sequence possesses a so-called Hermitian symmetry. This implies, in principle, that only one-half of a complete data set need be acquired since the other half can be derived subsequently through a simple operation of complex-conjugation mapping. Such data synthesis techniques are by now well-known in the art and are described, for example, in issued U.S. Pat. No. 4,728,893—Feinberg (commonly assigned with the present application).

If such data synthesis techniques are employed, the entire spin echo no longer needs to be developed within the actual time domain sampling window used to measure the spin echo response. This does away with one constraint which otherwise limits the minimum TE (and/or sampling bandwidth).

In practice, there are many factors which affect and destroy the theoretically exact symmetry which should be present. One dominant factor in a well-shimmed superconducting magnet, for example, may be a phase error caused by an induced eddy current field (e.g., induced by the strong slice-selection gradient pulses $G_z$). The extra phase modulation of the eventual SE caused by remnant eddy current fields can be measured in one or more extra "calibration" cycle(s) (e.g., by avoiding phase encoding $G_y$ and readout $G_x$ gradients) with the phase of this resulting calibration data being used to correct the acquired image data set. Such correction for spurious magnetic field changes are described in more detail, for example, in the above-referenced related copending commonly assigned application.

Another factor which degrades the symmetry somewhat is T2 decay over the SE sample window. However this source of error is sufficiently small that it does not eliminate the benefits of data synthesis by conjugation techniques.

It will be noted in FIG. 2 that both the 90° and 180° RF nutation pulses have envelopes which are symmetrically truncated sinc-like shapes. For example, in one typical prior art embodiment, a truncated approximately sinc-shaped RF pulse envelope was used which extends for ten zero crossings (i.e. five to each side of the peak). The same envelope shape was used for both the 90° nutation pulse and the 180° nutation pulse—except that the 180° nutation pulse has an amplitude which is twice that of the 90 degree nutation pulse. Typically, the duration of such pulses is inversely proportional to the thickness of the slice-volume which is being imaged. For thin slices, the duration of the required RF nutation pulses may be adversely long (e.g., meaning that the minimum TE time is correspondingly lengthened thus increasing the exponential loss of measured SE response due to T2 NMR relaxation effects).

Figure 3:
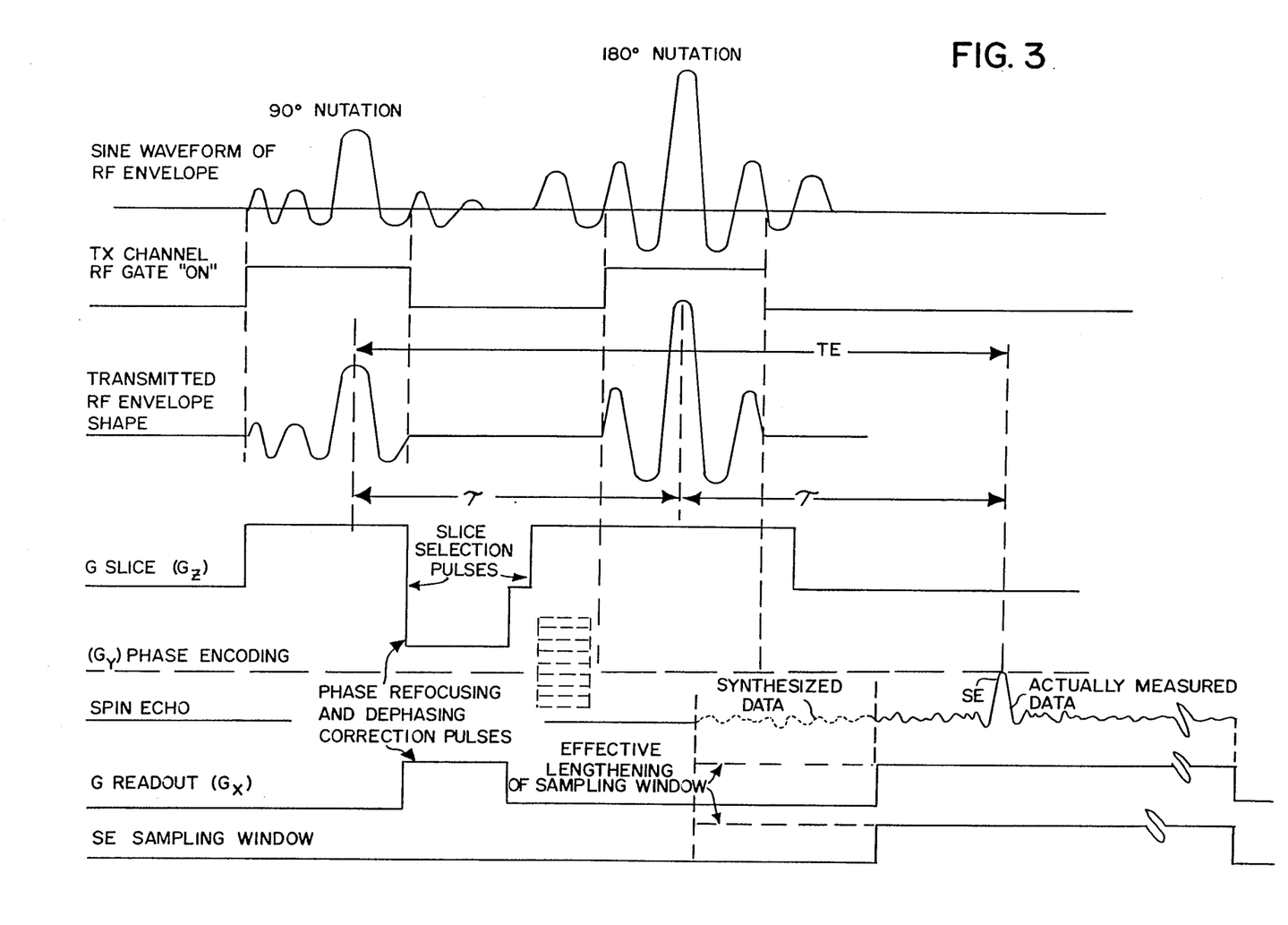
FIG. 3 depicts an exemplary modified NMR data gathering sequence which employs both an asymmetric 90° nutation pulse envelope and an asymmetric sampling window for the resulting spin echo RF response.

Accordingly, especially for thin slices, a different approach is proposed in the exemplary embodiment of this invention as depicted in FIG. 3. Here, an asymmetrically shaped envelope is used for the 90° nutation pulse and a six (total) zero crossing 180° RF nutation pulse is used (with a symmetrically shaped sinc-like envelope). By appropriately directing the asymmetry of the 90° nutation pulse (i.e., to truncate envelope portions extending towards the subsequent 180° pulse as depicted in FIG. 3), the necessary time between the 90° and 180° RF pulses (e.g., for gradient phase refocusing and de-phasing) can be provided while still decreasing the minimum time delay interval before 180° nutation—and thus the time interval TE. Calculations can be made to show that the 90° and 180° pulse pair shown in FIG. 3 still provide the necessary NMR nuclei nutations so as to produce the requisite spin echo response (so long as the amplitude of the asymmetrically truncated sinc envelope is adjusted to provide the same included area thereunder as was previously used with the symmetrically truncated envelope) without significant degradation to the profile of the slice-volume being imaged.

At the same time, somewhat similar to the prior art suggestion of Provost et al (referenced earlier) the preferred exemplary embodiment utilizes asymmetric sampling of the spin echo. That is, the sampling window is asymmetrically situated with respect to the peak of the spin echo envelope. The asymmetric positioning of the sampling window itself, of course, permits the actual sampling window to be extended significantly in the direction away from the 180° pulse in FIG. 3 so as to extend the total duration of the sampling window in accordance with prior art teachings such as Provost et al.

However, in addition, in the preferred exemplary embodiment, synthesized data (using complex-conjugate synthesis) is asymmetrically generated as depicted in FIG. 3 so as to fill in only the "missing" asymmetric portions of the asymmetrically sampled spin echo response data. In this manner, a complete composite spin echo response data set is provided which appears to be symmetric—albeit an asymmetric portion of this data set actually comprises synthesized data. By minimizing the amount of data in the complete final data set that has been synthesized, errors caused by synthesis are similarly minimized.

Since the typically available conventional MRI systems already include programmable gates for gating "on" and "off" RF nutation pulses (as well as shaping such pulses into desired sinc-shapes or otherwise) and for gating "on" and "off" desired magnetic gradient pulses, the occurrence of spin echo sampling windows, etc., implementation of the exemplary embodiment depicted in FIG. 3 requires only that sequencing control programs (e.g., in control computer 24 and/or associated computer systems 26) be suitably programmed so as to control the gating elements differently. Accordingly, such reprogramming is believed to be well within the ordinary skill of those working in this art and no further description is believed to be necessary.

Figure 4:
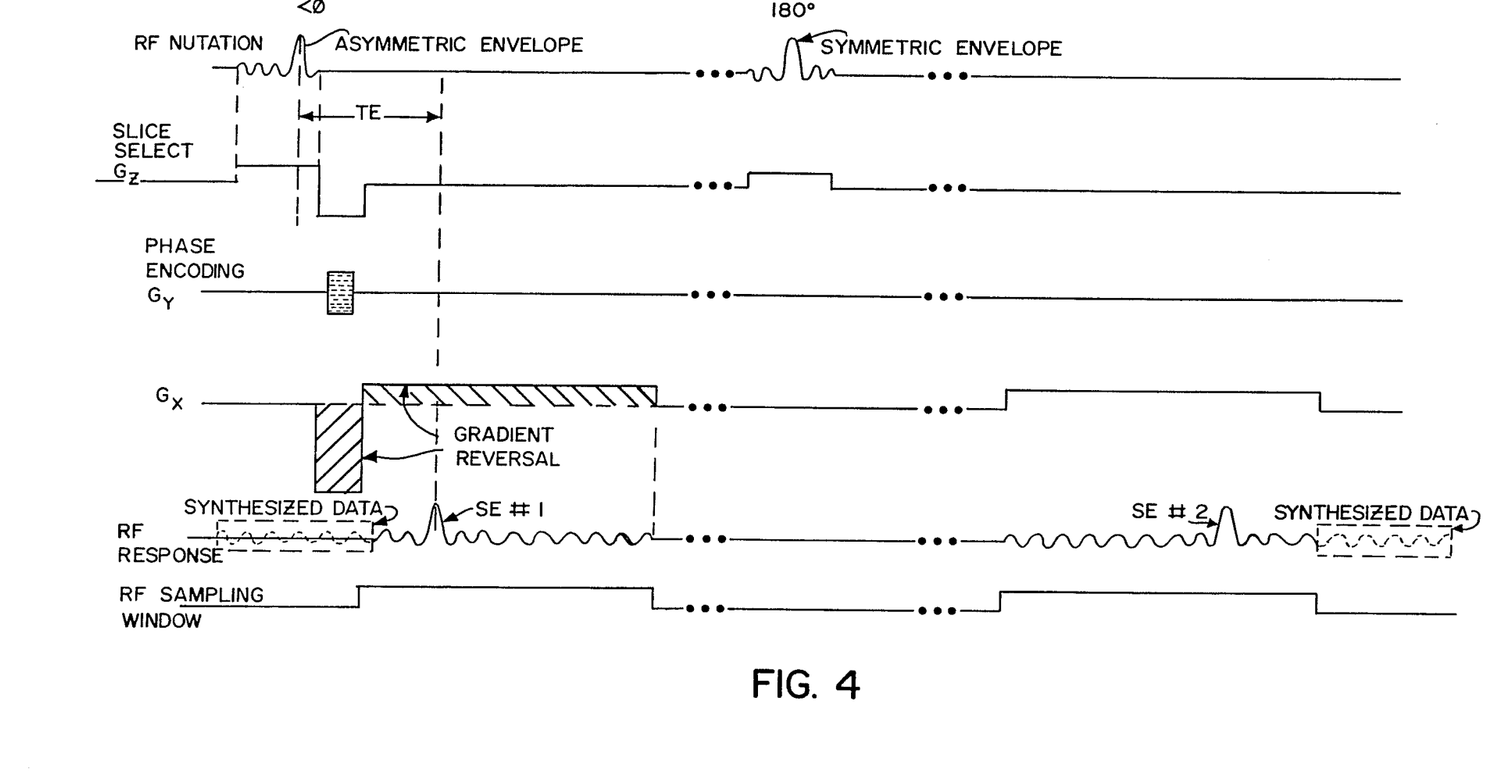
FIG. 4 depicts an exemplary modified NMR data gathering sequence which employs gradient reversal to generate the NMR RF response and which may optionally also include a subsequent inversion RF pulse to recall such response where asymmetry may be employed in the RF nutation pulse(s) and in the synthesis of RF response data.

Another examplary embodiment is depicted in FIG. 4. Here known gradient reversal techniques are used to recall an FID-type of spin echo at a time TE after an initial RF nutation pulse (which may purposefully be kept to a relatively small nutation angle so as to facilitate short TR). Here an asymmetric $G_x$ gradient reversal and/or an asymmetric initial RF nutation pulse envelope may be used to reduce TE. In addition, asymmetric SE sampling coupled with asymmetric synthesis of the "missing" SE data may be employed as in the earlier described examplary embodiment.

In addition, if desired (e.g. to measure T2 and/or to increase S/N ratio), a subsequent slice selective 180 degree RF nutation pulse may be employed to recall the spin echo. Here the second spin echo may also be asymmetrically sampled—but in an opposite direction (as shown in FIG. 4) so as to minimize required TR. The asymmetrically synthesized data is similarly synthesized in an opposite time direction so as to "fill in" the missing SE data and to provide a complete composite data set representing a symmetrical SE.

In another non-illustrated version of the FIG. 4 embodiment, the first spin echo could be recalled with a 180 degree RF nutation pulse instead of a gradient reversal. In this case, the first and second spin echos would constitute true spin echoes in even the most strict sense.

As will be recognized, the use of asymmetric RF nutation pulses may find application in a diverse assortment of MRI systems employing many different types of NMR measurement sequences (including those which rely on FID rather than or in addition to SE responses and those using only single RF nutation pulses).

While only one exemplary embodiment has been described in detail, those skilled in the art will recognize that many variations and modifications may be made in the exemplary embodiment while still retaining many of the novel features and advantages of this invention. Accordingly, all such variations and modifications are intended to be included within the scope of the appended claims.

What is claimed is:

1. In a magnetic resonance imaging system of the type which elicits NMR RF responses from an imaged object volume by using at least one slice-selective NMR RF pulse having a shaped envelope, the improvement comprising:
   means for generating and transmitting at least one slice-selective NMR RF pulse with an asymmetric envelope;
   means for receiving a spin echo NMR RF response, which results at least in part from said RF pulse, during a sampling window which is asymmetrically positioned in the time domain with respect to a maximum envelope peak in the spin echo; and
   means for asymmetrically synthesizing spin echo response data not actually sampled by use of assumed complex conjugate symmetry so as to supply partly synthesized completed spin echo data representing a theoretical sampling window symmetrically positioned in the time domain about said envelope peak.

2. An improved magnetic resonance imaging system as in claim 1 wherein said means for generating and transmitting includes:
   means for generating NMR RF pulses having approximately sinc-shaped envelopes;
   means for generating and transmitting a first nutation NMR RF pulse having a sinc-shaped envelope truncated asymmetrically;
   means for generating a magnetic gradient pulse to refocus the NMR spins subsequent to said first nutation pulse; and
   means for generating and transmitting a subsequent 180° nutation NMR RF pulse having an approximately sinc-shaped envelope truncated symmetrically.

3. An improved magnetic resonance imaging system as in claim 1 or 2 wherein:
   said means for generating and transmitting generates said asymmetric envelope by asymmetric truncation of an RF pulse envelope in a direction which causes a reduced T2 decay of the NMR RF response.

4. An improved magnetic resonance imaging system as in claim 3 wherein:
   said means for receiving samples said NMR RF response asymmetrically in the time domain in a direction subsequent to a maximum envelope peak of the NMR RF response.

5. In a magnetic resonance imaging system of the type which elicits NMR RF responses from an imaged object volume by using at least one slice-selective NMR RF pulse having a shaped envelope and by measuring the resulting NMR RF response during a sampling window, the improvement comprising:
   means for causing the sampling window to be asymmetrically positioned with respect to a maximum envelope peak in the NMR RF response; and
   means for asymmetrically synthesizing pseudo NMR RF response data not actually measured so as to supply complete, partly synthesized, NMR RF data representing a theoretical sampling window symmetrically positioned about said maximum envelope peak.

6. An improved magnetic resonance imaging system as in claim 5 further comprising:
   means for causing at least one of said RF pulses to have an asymmetrically shaped envelope.

7. An improved magnetic resonance imaging system as in claim 6 wherein said asymmetric positioning of said sampling window and said asymmetric shaping of the RF pulse envelope are directed to reduce T2 decay of the measured NMR RF response.

8. In a magnetic resonance imaging method of the type which elicits NMR RF responses from an imaged object volume by using at least one slice-selective NMR RF pulse having shaped envelope, the improvement comprising:
   generating and transmitting at least one slice-selective NMR RF pulse with an asymmetric envelope;

receiving a spin echo NMR RF response during a sampling window which is asymmetrically positioned in the time domain with respect to a maximum envelope peak in the spin echo; and asymmetrically synthesizing spin echo response data not actually sampled by use of assumed complex conjugate symmetry so as to supply partly synthesized completed spin echo data representing a theoretical sampling window symmetrically positioned in the time domain about said envelope peak.

9. An improved magnetic resonance imaging method as in claim 8 wherein said generating and transmitting step includes:

generating NMR RF pulses having sinc-shaped envelopes;

generating and transmitting a first nutation NMR RF pulse having a sinc-shaped envelope truncated asymmetrically; and generating and transmitting a subsequent 180° nutation NMR RF pulse having a sinc-shaped envelope truncated symmetrically.

10. An improved magnetic resonance imaging method as in claim 8 or 9 wherein:

said generating and transmitting step generates said asymmetric envelope by asymmetric truncation of an RF pulse envelope in a direction which causes a reduced T2 decay of the NMR RF response.

11. An improved magnetic resonance imaging method as in claim 10 wherein:

said receiving and processing step samples said NMR RF response asymmetrically in the time domain in a direction subsequent to a maximum envelope peak of the NMR RF response.

12. In a magnetic resonance imaging method of the type which elicits NMR RF responses from an imaged object volume by using at least one slice-selective NMR RF pulse having a shaped envelope and by measuring the resulting NMR RF response during a sampling window, the improvement comprising:

causing the sampling window to be asymmetrically positioned with respect to a maximum envelope peak in the NMR RF response; and asymmetrically synthesizing pseudo NMR RF response data not actually measured so as to supply complete, partly synthesized, NMR RF data representing a theoretical sampling window symmetrically positioned about said maximum envelope peak.

13. An improved magnetic resonance imaging method as in claim 12 further comprising:

causing at least one of said RF pulses to have an asymmetrically shaped envelope.

14. An improved magnetic resonance imaging method as in claim 13 wherein said asymmetric positioning of said sampling window and said asymmetric shaping of the RF pulse envelope are directed to reduce T2 decay of the measured NMR RF response.

* * * * *

Disclaimer 4,837,513—*Ching Yao*, Belmont, Calif. MRI USING ASYMMETRIC RF NUTATION PULSES AND ASYMMETRIC SYNTHESIS OF COMPLEX CONJUGATED SE DATA TO REDUCE TE AND T2 DECAY NMR SPIN ECHO RESPONSES. Patent dated June 6, 1989. Disclaimer filed Apr. 10, 1991, by the assignee, The Regents of the University of California.

Hereby enters this disclaimer to claims 5 and 12 of said patent.
[ *Official Gazette July 30, 1991* ]